US011549020B2

(12) United States Patent
Wan et al.

(10) Patent No.: US 11,549,020 B2
(45) Date of Patent: Jan. 10, 2023

(54) CURABLE COMPOSITION FOR NANO-FABRICATION

(71) Applicant: CANON KABUSHIKI KAISHA, Tokyo (JP)

(72) Inventors: Fen Wan, Austin, TX (US); Weijun Liu, Cedar Park, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 502 days.

(21) Appl. No.: 16/579,452

(22) Filed: Sep. 23, 2019

(65) Prior Publication Data

US 2021/0087407 A1 Mar. 25, 2021

(51) Int. Cl.
*C08F 2/46* (2006.01)
*C08F 2/50* (2006.01)
*C08G 61/04* (2006.01)
*C09D 4/00* (2006.01)
*C08F 220/18* (2006.01)
*G03F 7/00* (2006.01)

(52) U.S. Cl.
CPC .......... *C09D 4/00* (2013.01); *C08F 220/1811* (2020.02); *G03F 7/0002* (2013.01)

(58) Field of Classification Search
CPC .... C08F 220/1811; C08F 232/00; C09D 4/00; G03F 7/0002
USPC .......................... 522/183, 182, 178, 1; 520/1
See application file for complete search history.

(56) References Cited

U.S. PATENT DOCUMENTS

| | | | |
|---|---|---|---|
| 5,300,380 A | 4/1994 | Roth | |
| 6,106,998 A | 8/2000 | Maeda et al. | |
| 6,830,646 B2 | 12/2004 | Patel et al. | |
| 6,936,194 B2 | 8/2005 | Watts | |
| 7,157,036 B2 | 1/2007 | Choi et al. | |
| 8,066,930 B2 | 11/2011 | Sreenivasan et al. | |
| 8,076,386 B2 | 12/2011 | Xu et al. | |
| 8,349,241 B2 | 1/2013 | Sreenivasan et al. | |
| 2006/0171627 A1 | 8/2006 | Aoki et al. | |
| 2007/0142494 A1 | 6/2007 | Kalgutkar et al. | |
| 2007/0196589 A1 | 8/2007 | Fu et al. | |
| 2008/0113283 A1 | 5/2008 | Ghoshal et al. | |
| 2009/0202942 A1 | 8/2009 | Fukui et al. | |
| 2010/0160478 A1 | 6/2010 | Nilsson et al. | |
| 2011/0008577 A1 | 1/2011 | Miyake et al. | |
| 2011/0042862 A1 | 2/2011 | Houle et al. | |
| 2011/0171431 A1 | 7/2011 | Ogino et al. | |
| 2011/0300482 A1 | 12/2011 | Suzuki et al. | |
| 2012/0027342 A1 | 2/2012 | Yoshida et al. | |
| 2012/0080826 A1 | 4/2012 | Saito | |
| 2012/0251948 A1 | 10/2012 | Iizuka et al. | |
| 2015/0028524 A1 | 1/2015 | Kobayashi et al. | |
| 2017/0305848 A1 | 10/2017 | Shiota et al. | |
| 2018/0039179 A1 | 2/2018 | Murai et al. | |
| 2018/0329297 A1 | 11/2018 | Fukunaga et al. | |
| 2019/0055392 A1* | 2/2019 | Bulters .................. | B33Y 70/00 |

FOREIGN PATENT DOCUMENTS

| | | |
|---|---|---|
| JP | 2003-128747 A | 5/2003 |
| JP | 2008-501825 A | 1/2008 |
| JP | 2008-142940 A | 6/2008 |
| JP | 2008-155344 A | 7/2008 |
| JP | 2008-189821 A | 8/2008 |
| JP | 2010-001419 A | 1/2010 |
| JP | 2011-003916 A | 1/2011 |
| JP | 4617387 B2 | 1/2011 |
| JP | 2011-157482 A | 8/2011 |
| JP | 4937806 B2 | 5/2012 |
| JP | 4982777 B2 | 7/2012 |
| JP | 5101343 B2 | 12/2012 |
| JP | 5180825 B2 | 4/2013 |
| JP | 5321228 B2 | 10/2013 |
| JP | 5349854 B2 | 11/2013 |
| JP | 5464980 B2 | 4/2014 |
| JP | 5623528 B2 | 11/2014 |
| JP | 5684460 B2 | 3/2015 |
| JP | 5697407 B2 | 4/2015 |
| JP | 5706651 B2 | 4/2015 |
| JP | 5725465 B2 | 5/2015 |
| JP | 2016-41790 A | 3/2016 |
| JP | 2016-115779 A | 6/2016 |
| JP | 5985442 B2 | 9/2016 |
| JP | 6279489 B2 | 2/2018 |
| JP | 2018-56273 A | 4/2018 |
| WO | 2014/112295 A1 | 7/2014 |

(Continued)

OTHER PUBLICATIONS

Bingquing Luo et al., Volume-expansion polymerization for UV-curable nanoimprinting, J. Vac. Sci. Technol. B, vol. 35(1), Jan./Feb. 2017, 011604-1-011604-6.
M. Sangermano et al., Synthesis of an Oxetane-Functionalized Hemispiroorthocarbonate Used as a Low-Shrinkage Additive in the Cationic Ultraviolet Curing of Oxetane Monomers, Journal of Applied Polymer Science vol. 112, 1780-1787 (2009).
G. Manivannan, J.P. Fouassier, Primary Processes in the Photosensitized Polymerization of Cationic Monomers, Journal of Polymer Science: Part A: Polymer Chemistry, vol. 29, 1113-1124 (1991).
Tsuyoshi Ogawa et al., Planarizing material for reverse-tone step and flash imprint lithography, J. Micro/Nanolith. MEMS MOEMS 13(3), 031302-1-031302-7 (Jul.-Sep. 2014).
Ricardo Acosta Ortiz et al., Novel diol spiro orthocarbonates derived from glycerol as anti-shrinkage additives for the cationic photopolymerization of epoxymonomers, Polym Int 2010; 59: 680-685.

(Continued)

*Primary Examiner* — Jessica Whiteley
(74) *Attorney, Agent, or Firm* — Canon U.S.A., Inc., IP Division

(57) ABSTRACT

A curable composition comprises at least 10 wt % expanding monomers based on a total weight of the curable composition, at least 25 wt % acrylate monomers based on the total weight of the curable composition, a photoinitiator, and a photosensitizer. The acrylate monomers have a molecular weight of 500 or less. The curable composition has a viscosity of 10 cP or less. A total amount of the expanding monomers and the acrylate monomers are at least 90 wt % based on the total weight of the curable composition.

20 Claims, 3 Drawing Sheets

(56) References Cited

FOREIGN PATENT DOCUMENTS

| WO | 2015/115128 A1 | 8/2015 |
| WO | 2016/194644 A1 | 12/2016 |
| WO | 2016187934 A1 | 12/2016 |
| WO | 2018/061822 A1 | 4/2018 |

OTHER PUBLICATIONS

Fu Jing et al., Properties of a New Dental Photocurable Resin based on the Expanding Monomer and Threecomponent Photoinitiator System, Journal of Wuhan University of Technology-Mater. Sci. Ed.Apr. 2014, vol. 29, Issue 2, pp. 384-390.

Cecil C. Chappelow et al., Photopolymerization of a Novel Tetraoxaspiroundecane and Silicon-Containing Oxiranes, Journal of Applied Polymer Science, vol. 103, 336-344 (2007).

Andreas Moeck et al., Shrinkage of UV Oligomers and Monomers, UV & EB Technical Conference Proceedings (2014).

\* cited by examiner

CURABLE COMPOSITION FOR NANO-FABRICATION

BACKGROUND

Field of Art

The present disclosure relates to a curable composition for nano-fabrication.

Description of the Related Art

Nano-fabrication includes the fabrication of very small structures that have features on the order of 100 nanometers or smaller. One application in which nano-fabrication has had a sizeable impact is in the fabrication of integrated circuits. The semiconductor processing industry continues to strive for larger production yields while increasing the circuits per unit area formed on a substrate. Improvements in nano-fabrication include providing greater process control and/or improving throughput while also allowing continued reduction of the minimum feature dimensions of the structures formed.

One nano-fabrication technique in use today is commonly referred to as nanoimprint lithography. Nanoimprint lithography is useful in a variety of applications including, for example, fabricating one or more layers of integrated devices by shaping a film on a substrate. Examples of an integrated device include but are not limited to CMOS logic, microprocessors, NAND Flash memory, NOR Flash memory, DRAM memory, MRAM, 3D cross-point memory, Re-RAM, Fe-RAM, SU-RAM, MEMS, and the like. Exemplary nanoimprint lithography systems and processes are described in detail in numerous publications, such as U.S. Pat. Nos. 8,349,241, 8,066,930, and 6,936,194, all of which are hereby incorporated by reference herein.

The nanoimprint lithography technique disclosed in each of the aforementioned patents describes the shaping of a film on a substrate by the formation of a relief pattern in a formable material (polymerizable) layer. The shape of this film may then be used to transfer a pattern corresponding to the relief pattern into and/or onto an underlying substrate.

The patterning process uses a template spaced apart from the substrate and the formable material is applied between the template and the substrate. The template is brought into contact with the formable material causing the formable material to spread and fill the space between the template and the substrate. The formable liquid is solidified to form a film that has a shape (pattern) conforming to a shape of the surface of the template that is in contact with the formable liquid. After solidification, the template is separated from the solidified layer such that the template and the substrate are spaced apart.

The substrate and the solidified layer may then be subjected to additional processes, such as etching processes, to transfer an image into the substrate that corresponds to the pattern in one or both of the solidified layer and/or patterned layers that are underneath the solidified layer. The patterned substrate can be further subjected to known steps and processes for device (article) fabrication, including, for example, curing, oxidation, layer formation, deposition, doping, planarization, etching, formable material removal, dicing, bonding, and packaging, and the like.

When performing an imprinting or planarization as part of nano-fabrication, as will be discussed below in more detail, after a curable composition is dispensed, it is then cured, such as by exposing the curable composition to ultraviolet (UV) radiation. However, known curable compositions, in particular acrylate monomer based compositions, experience volume shrinkage during the curing. The volume shrinkage of acrylate based compositions for example may be from 4-20%. The volume shrinkage is primarily a result of relatively long distance van der Waals bonds being replaced by much shorter covalent bonds during curing. For example, a van der Waal bond is typically 3 to 5 angstroms, while a covalent bond is typically 1 to 2 angstroms. Volume shrinkage in the range of 4-20% causes adverse effects on imprinting and planarization. See, e.g., Moeck et al., "Shrinkage of UV Oligomers and Monomers," UV & EB Technical Conference Proceedings (2014). Volume shrinkage is particularly disadvantageous for planarization because volume shrinkage results in a non-flat surface. Disclosed herein is a curable composition that minimizes the above-described shrinkage.

SUMMARY

A curable composition comprises at least 10 wt % expanding monomers based on a total weight of the curable composition, at least 25 wt % acrylate monomers based on the total weight of the curable composition, a photoinitiator, and a photosensitizer. The acrylate monomers have a molecular weight of 500 or less. The curable composition has a viscosity of 10 cP or less. The total amount of the expanding monomers and the acrylate monomers are at least 90 wt % based on the total weight of the curable composition A dispensing system comprises a first chuck configured to hold a template or a superstrate, a second chuck configured to hold a substrate, a dispensing system configured to dispense a curable composition on the substrate, a positioning system configured to bring the template or superstrate into contact with the curable composition on the substrate, and a radiation source configured to cure the curable composition by exposing the curable composition to radiation. The curable composition comprises at least 10 wt % expanding monomers based on a total weight of the curable composition, at least 25 wt % acrylate monomers based on the total weight of the curable composition, a photoinitiator, and a photosensitizer. The acrylate monomers have a molecular weight of 500 or less. The curable composition has a viscosity of 10 cP or less. The total amount of the expanding monomers and the acrylate monomers are at least 90 wt % based on the total weight of the curable composition A method of making an article comprises contacting a curable composition on a substrate with a template or superstrate, curing the curable material by exposing the curable material to radiation to form a cured composition, separating the template or superstrate from the cured composition; and processing the substrate on which the cured composition has been formed to manufacture the article. The curable composition comprises at least 10 wt % expanding monomers based on a total weight of the curable composition, at least 25 wt % acrylate monomers based on the total weight of the curable composition, a photoinitiator, and a photosensitizer. The acrylate monomers have a molecular weight of 500 or less. The curable composition has a viscosity of 10 cP or less. The total amount of the expanding monomers and the acrylate monomers are at least 90 wt % based on the total weight of the curable composition These and other objects, features, and advantages of the present disclosure will become apparent upon reading the following detailed description of exemplary embodiments of the present disclosure, when taken in conjunction with the appended drawings, and provided claims.

BRIEF DESCRIPTION OF DRAWINGS

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention, and are therefore not to be considered limiting of its scope, for the invention may admit to other equally effective embodiments.

Figure 1:
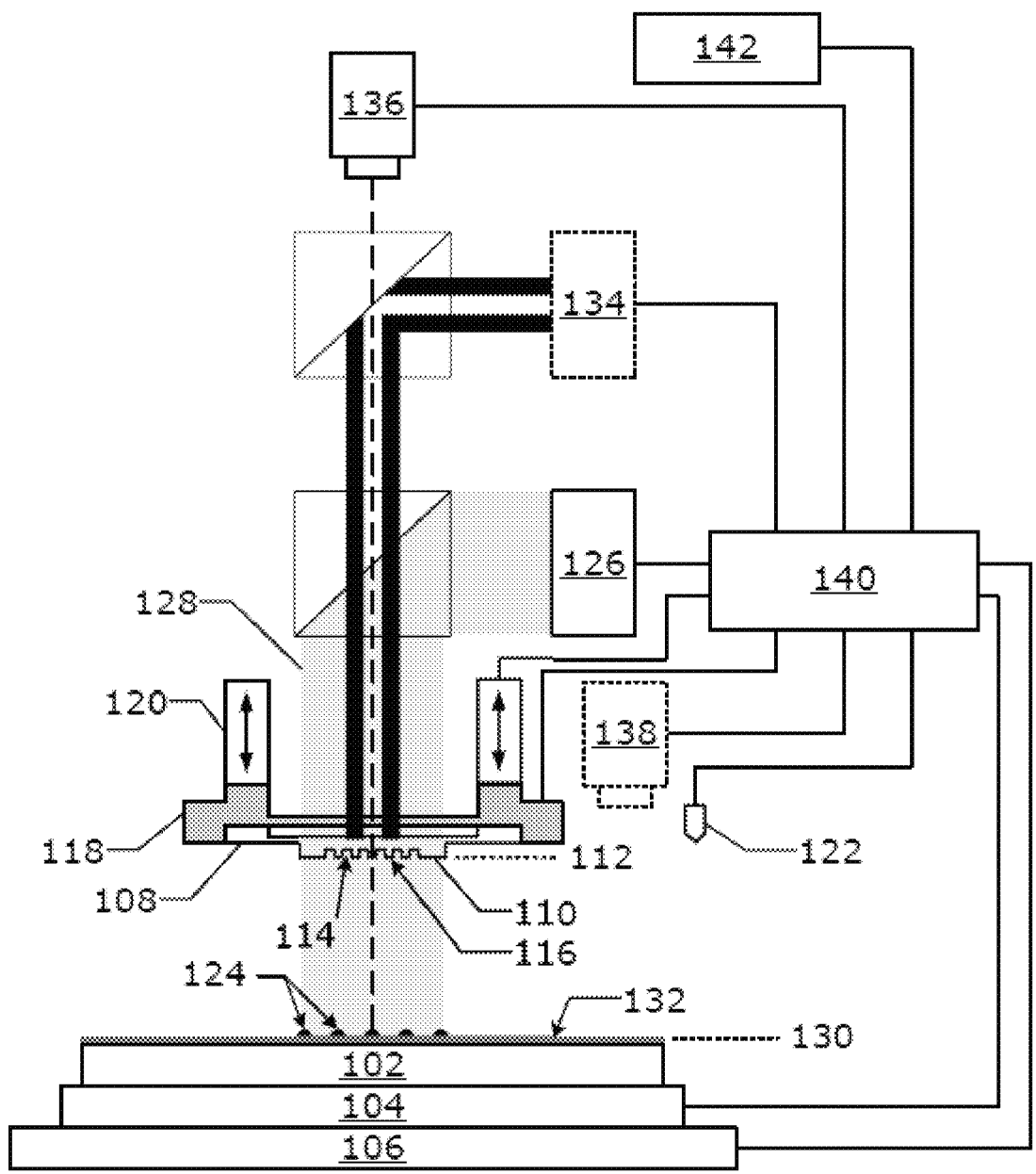
FIG. 1 is an illustration of an exemplary nanoimprint lithography system having a template with a mesa spaced apart from a substrate in accordance with an example embodiment.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

Throughout this disclosure, reference is made to nanoimprint lithography, which uses the above-mentioned patterned template to impart a pattern onto formable liquid. However, as mentioned below, in an alternative embodiment, the template is featureless in which case a planar surface may be formed on the substrate. In such embodiments where a planar surface is formed, the formation process is referred to as planarization. Thus, throughout this disclosure, whenever nanoimprint lithography is mentioned, it should be understood that the same method is applicable to planarization. The term superstrate is used in place of the term template in instances where the template is featureless. Additionally, it should be understood that the term "formable liquid" is used interchangeably with "curable composition."

Nanoimprint System (Shaping System)

FIG. 1 is an illustration of a nanoimprint lithography system 100 in which an embodiment may be implemented. The nanoimprint lithography system 100 is used to shape a film on a substrate 102. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like.

The substrate 102 and the substrate chuck 104 may be further supported by a substrate positioning stage 106. The substrate positioning stage 106 may provide translational and/or rotational motion along one or more of the x, y, z, θ, and φ-axes. The substrate positioning stage 106, the substrate 102, and the substrate chuck 104 may also be positioned on a base (not shown). The substrate positioning stage may be a part of a positioning system.

Spaced-apart from the substrate 102 is a template 108. The template 108 may include a body having a mesa (also referred to as a mold) 110 extending towards the substrate 102 on a front side of the template 108. The mesa 110 may have a patterning surface 112 thereon also on the front side of the template 108. Alternatively, the template 108 may be formed without the mesa 110, in which case the surface of the template facing the substrate 102 is equivalent to the mold 110 and the patterning surface 112 is that surface of the template 108 facing the substrate 102.

The template 108 may be formed from such materials including, but not limited to, fused-silica, quartz, silicon, organic polymers, siloxane polymers, borosilicate glass, fluorocarbon polymers, metal, hardened sapphire, and/or the like. The patterning surface 112 may have features defined by a plurality of spaced-apart template recesses 114 and/or template protrusions 116. The patterning surface 112 defines a pattern that forms the basis of a pattern to be formed on the substrate 102. In an alternative embodiment, the patterning surface 112 is featureless in which case a planar surface is formed on the substrate. In an alternative embodiment, the patterning surface 112 is featureless and the same size as the substrate and a planar surface is formed across the entire substrate. In such embodiments where a planar surface is formed, the formation process may be alternatively referred to as planarization and the featureless template may be alternatively referred to as a superstrate.

Template 108 may be coupled to a template chuck 118. The template chuck 118 may be, but is not limited to, vacuum chuck, pin-type chuck, groove-type chuck, electrostatic chuck, electromagnetic chuck, and/or other similar chuck types. The template chuck 118 may be configured to apply stress, pressure, and/or strain to template 108 that varies across the template 108. The template chuck 118 may include piezoelectric actuators which can squeeze and/or stretch different portions of the template 108. The template chuck 118 may include a system such as a zone based vacuum chuck, an actuator array, a pressure bladder, etc. which can apply a pressure differential to a back surface of the template causing the template to bend and deform.

The template chuck 118 may be coupled to an imprint head 120 which is a part of the positioning system. The imprint head may be moveably coupled to a bridge. The imprint head may include one or more actuators such as voice coil motors, piezoelectric motors, linear motor, nut and screw motor, etc., which are configured to move the template chuck 118 relative to the substrate in at least the z-axis direction, and potentially other directions (e.g. x, y, θ, ψ, and φ-axes).

The nanoimprint lithography system 100 may further comprise a fluid dispenser 122. The fluid dispenser 122 may also be moveably coupled to the bridge. In an embodiment, the fluid dispenser 122 and the imprint head 120 share one or more or all positioning components. In an alternative embodiment, the fluid dispenser 122 and the imprint head 120 move independently from each other. The fluid dispenser 122 may be used to deposit liquid formable material 124 (e.g., polymerizable material) onto the substrate 102 in a pattern. Additional formable material 124 may also be added to the substrate 102 using techniques, such as, drop dispense, spin-coating, dip coating, chemical vapor deposition (CVD), physical vapor deposition (PVD), thin film deposition, thick film deposition, and/or the like prior to the formable material 124 being deposited onto the substrate 102. The formable material 124 may be dispensed upon the substrate 102 before and/or after a desired volume is defined between the mold 112 and the substrate 102 depending on design considerations. The formable material 124 may comprise a mixture including a monomer as described in U.S. Pat. Nos. 7,157,036 and 8,076,386, both of which are herein incorporated by reference.

Different fluid dispensers 122 may use different technologies to dispense formable material 124. When the formable material 124 is jettable, ink jet type dispensers may be used to dispense the formable material. For example, thermal ink jetting, microelectromechanical systems (MEMS) based ink jetting, valve jet, and piezoelectric ink jetting are common techniques for dispensing jettable liquids.

The nanoimprint lithography system 100 may further comprise a radiation source 126 that directs actinic energy along an exposure path 128. The imprint head and the substrate positioning stage 106 may be configured to position the template 108 and the substrate 102 in superimposition with the exposure path 128. The radiation source 126 sends the actinic energy along the exposure path 128 after the template 108 has made contact with the formable material 128. FIG. 1 illustrates the exposure path 128 when the template 108 is not in contact with the formable material 124, this is done for illustrative purposes so that the relative position of the individual components can be easily identified. An individual skilled in the art would understand that exposure path 128 would not substantially change when the template 108 is brought into contact with the formable material 124.

The nanoimprint lithography system 100 may further comprise a field camera 136 that is positioned to view the spread of formable material 124 after the template 108 has made contact with the formable material 124. FIG. 1 illustrates an optical axis of the field camera's imaging field as a dashed line. As illustrated in FIG. 1 the nanoimprint lithography system 100 may include one or more optical components (dichroic mirrors, beam combiners, prisms, lenses, mirrors, etc.) which combine the actinic radiation with light to be detected by the field camera. The field camera 136 may be configured to detect the spread of formable material under the template 108. The optical axis of the field camera 136 as illustrated in FIG. 1 is straight but may be bent by one or more optical components. The field camera 136 may include one or more of a CCD, a sensor array, a line camera, and a photodetector which are configured to gather light that has a wavelength that shows a contrast between regions underneath the template 108 that are in contact with the formable material, and regions underneath the template 108 which are not in contact with the formable material 124. The field camera 136 may be configured to gather monochromatic images of visible light. The field camera 136 may be configured to provide images of the spread of formable material 124 underneath the template 108, the separation of the template 108 from cured formable material, and can be used to keep track the progress over the imprinting process.

The nanoimprint lithography system 100 may further comprise a droplet inspection system 138 that is separate from the field camera 136. The droplet inspection system 138 may include one or more of a CCD, a camera, a line camera, and a photodetector. The droplet inspection system 138 may include one or more optical components such as a lenses, mirrors, apertures, filters, prisms, polarizers, windows, adaptive optics, and/or light sources. The droplet inspection system 138 may be positioned to inspect droplets prior to the patterning surface 112 contacting the formable material 124 on the substrate 102.

The nanoimprint lithography system 100 may further include a thermal radiation source 134 which may be configured to provide a spatial distribution of thermal radiation to one or both of the template 108 and the substrate 102. The thermal radiation source 134 may include one or more sources of thermal electromagnetic radiation that will heat up one or both of the substrate 102 and the template 108 and does not cause the formable material 124 to solidify. The thermal radiation source 134 may include a spatial light modulator such as a digital micromirror device (DMD), Liquid Crystal on Silicon (LCoS), Liquid Crystal Device (LCD), etc., to modulate the spatial temporal distribution of thermal radiation. The nanoimprint lithography system may further comprise one or more optical components which are used to combine the actinic radiation, the thermal radiation, and the radiation gathered by the field camera 136 onto a single optical path that intersects with the imprint field when the template 108 comes into contact with the formable material 124 on the substrate 102. The thermal radiation source 134 may send the thermal radiation along a thermal radiation path (which in FIG. 1 is illustrated as 2 thick dark lines) after the template 108 has made contact with the formable material 128. FIG. 1 illustrates the thermal radiation path when the template 108 is not in contact with the formable material 124, this is done for illustrative purposes so that the relative position of the individual components can be easily identified. An individual skilled in the art would understand that the thermal radiation path would not substantially change when the template 108 is brought into contact with the formable material 124. In FIG. 1 the thermal radiation path is shown terminating at the template 108, but it may also terminate at the substrate 102. In an alternative embodiment, the thermal radiation source 134 is underneath the substrate 102, and thermal radiation path is not combined with the actinic radiation and visible light.

Prior to the formable material 124 being dispensed onto the substrate, a substrate coating 132 may be applied to the substrate 102. In an embodiment, the substrate coating 132 may be an adhesion layer. In an embodiment, the substrate coating 132 may be applied to the substrate 102 prior to the substrate being loaded onto the substrate chuck 104. In an alternative embodiment, the substrate coating 132 may be applied to substrate 102 while the substrate 102 is on the substrate chuck 104. In an embodiment, the substrate coating 132 may be applied by spin coating, dip coating, etc. In an embodiment, the substrate 102 may be a semiconductor wafer. In another embodiment, the substrate 102 may be a blank template (replica blank) that may be used to create a daughter template after being imprinted.

The nanoimprint lithography system 100 may be regulated, controlled, and/or directed by one or more processors 140 (controller) in communication with one or more components and/or subsystems such as the substrate chuck 104, the substrate positioning stage 106, the template chuck 118, the imprint head 120, the fluid dispenser 122, the radiation source 126, the thermal radiation source 134, the field camera 136 and/or the droplet inspection system 138. The processor 140 may operate based on instructions in a computer readable program stored in a non-transitory computer readable memory 142. The processor 140 may be or include one or more of a CPU, MPU, GPU, ASIC, FPGA, DSP, and a general purpose computer. The processor 140 may be a purpose built controller or may be a general purpose computing device that is adapted to be a controller. Examples of a non-transitory computer readable memory include but are not limited to RAM, ROM, CD, DVD, Blu-Ray, hard drive, networked attached storage (NAS), an intranet connected non-transitory computer readable storage device, and an internet connected non-transitory computer readable storage device.

Either the imprint head 120, the substrate positioning stage 106, or both varies a distance between the mold 110 and the substrate 102 to define a desired space (a bounded physical extent in three dimensions) that is filled with the formable material 124. For example, the imprint head 120 may apply a force to the template 108 such that mold 110 is in contact with the formable material 124. After the desired volume is filled with the formable material 124, the radiation source 126 produces actinic radiation (e.g. UV, 248 nm, 280 nm, 350 nm, 365 nm, 395 nm, 400 nm, 405 nm, 435 nm, etc.) causing formable material 124 to cure, solidify, and/or cross-link; conforming to a shape of the substrate surface 130 and the patterning surface 112, defining a patterned layer on the substrate 102. The formable material 124 is cured while the template 108 is in contact with formable material 124 forming the patterned layer on the substrate 102. Thus, the nanoimprint lithography system 100 uses an imprinting process to form the patterned layer which has recesses and protrusions which are an inverse of the pattern in the patterning surface 112. In an alternative embodiment, the nanoimprint lithography system 100 uses an imprinting process to form the planar layer with a featureless patterning surface 112.

The imprinting process may be done repeatedly in a plurality of imprint fields that are spread across the substrate surface 130. Each of the imprint fields may be the same size as the mesa 110 or just the pattern area of the mesa 110. The pattern area of the mesa 110 is a region of the patterning surface 112 which is used to imprint patterns on a substrate 102 which are features of the device or are then used in subsequent processes to form features of the device. The pattern area of the mesa 110 may or may not include mass velocity variation features which are used to prevent extrusions. In an alternative embodiment, the substrate 102 has only one imprint field which is the same size as the substrate 102 or the area of the substrate 102 which is to be patterned with the mesa 110. In an alternative embodiment, the imprint fields overlap. Some of the imprint fields may be partial imprint fields which intersect with a boundary of the substrate 102.

The patterned layer may be formed such that it has a residual layer having a residual layer thickness (RLT) that is a minimum thickness of formable material 124 between the substrate surface 130 and the patterning surface 112 in each imprint field. The patterned layer may also include one or more features such as protrusions which extend above the residual layer having a thickness. These protrusions match the recesses 114 in the mesa 110.

Template/Superstrate

Figure 2:
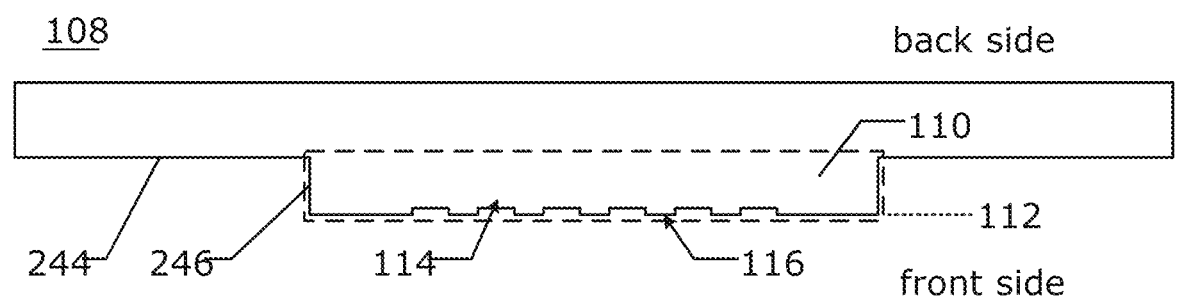
FIG. 2 is an illustration of an exemplary template in accordance with an example embodiment.

FIG. 2 is an illustration of a template 108 that may be used in an embodiment. The patterning surface 112 may be on a mesa 110 (identified by the dashed box in FIG. 2). The mesa 110 is surrounded by a recessed surface 244 on the front side of the template. Mesa sidewalls 246 connect the recessed surface 244 to patterning surface 112 of the mesa 110. The mesa sidewalls 246 surround the mesa 110. In an embodiment in which the mesa is round or has rounded corners, the mesa sidewalls 246 refers to a single mesa sidewall that is a continuous wall without corners.

An alternative template may be used in another embodiment, referred herein as a superstrate. In the case of the superstrate, there may be no mesa, and the patterning surface 112 is featureless. That is, in an embodiment there is no pattern on the surface 112. A superstrate with no pattern is used in a planarization process. Thus, when a planarization process is performed, the superstrate is used in place of the template shown in FIG. 1.

Imprinting/Planarizing Process

Figure 3:
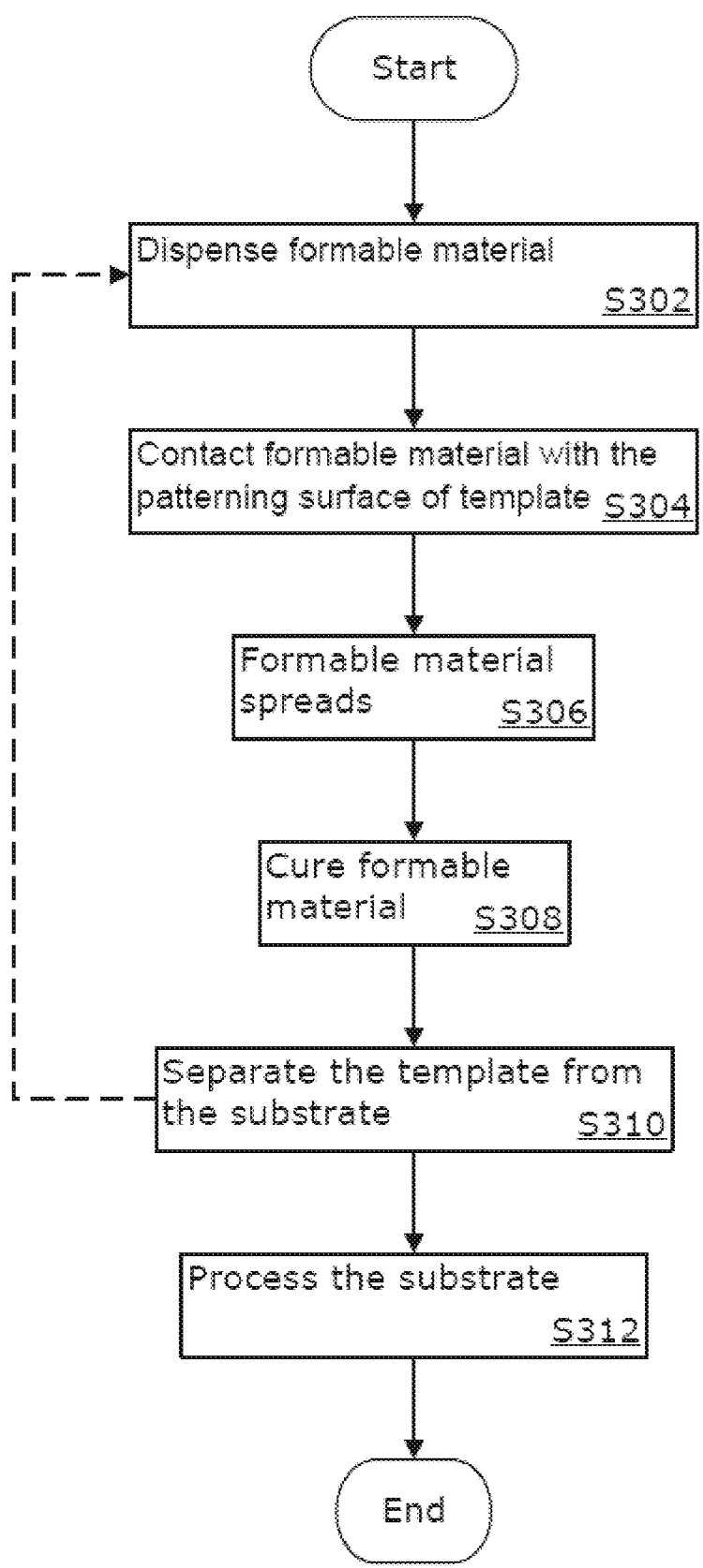
FIG. 3 is a flowchart illustrating an exemplary imprinting method in accordance with an example embodiment.

FIG. 3 is a flowchart of an imprinting process 300 by the nanoimprint lithography system 100 that can be used to form patterns in formable material 124 on one or more imprint fields (also referred to as: pattern areas or shot areas). The imprinting process 300 may be performed repeatedly on a plurality of substrates 102 by the nanoimprint lithography system 100. The processor 140 may be used to control imprinting process 300.

In an alternative embodiment, a similar process may be performed to planarize the substrate 102. In the case of planarizing, substantially the same steps discussed herein with respect to FIG. 3 are performed, except that a patternless superstrate is used in place of the template while the substrate may have no pattern or may have a pattern. Thus, it should be understood that the following description is also applicable to a planarizing method. When using as superstrate, the superstrate may be the same size or larger than the substrate 102 and may be similar in size to the area to be planarized.

The beginning of the imprinting process 300 may include a template mounting step causing a template conveyance mechanism to mount a template 108 onto the template chuck 118. The imprinting process may also include a substrate mounting step, the processor 140 may cause a substrate conveyance mechanism to mount the substrate 102 onto the substrate chuck 104. The substrate may have one or more coatings and/or structures. The order in which the template 108 and the substrate 102 are mounted onto the nanoimprint lithography system 100 is not particularly limited, and the template 108 and the substrate 102 may be mounted sequentially or simultaneously.

In a positioning step, the processor 140 may cause one or both of the substrate positioning stage 106 and/or a dispenser positioning stage to move an imprint field i (index i may be initially set to 1) of the substrate 102 to a fluid dispense position below the fluid dispenser 122. The substrate 102, may be divided into N imprint fields, wherein each imprint field is identified by an index i. In which N is a real integer such as 1, 10, 75, etc. $\{N \in \mathbb{Z}^+\}$. In a dispensing step S302, the processor 140 may cause the fluid dispenser 122 to dispense formable material onto an imprint field i. In an embodiment, the fluid dispenser 122 dispenses the formable material 124 as a plurality of droplets. The fluid dispenser 122 may include one nozzle or multiple nozzles. The fluid dispenser 122 may eject formable material 124 from the one or more nozzles simultaneously. The imprint field i may be moved relative to the fluid dispenser 122 while the fluid dispenser is ejecting formable material 124. Thus, the time at which some of the droplets land on the substrate may vary across the imprint field i. In an embodiment, during the dispensing step S302, the formable material 124 may be dispensed onto a substrate in accordance with a drop pattern. The drop pattern may include information such as one or more of position to deposit drops of formable material, the volume of the drops of formable material, type of formable material, shape parameters of the drops of formable material, etc.

After, the droplets are dispensed, then a contacting step S304 may be initiated, the processor 140 may cause one or both of the substrate positioning stage 106 and a template positioning stage to bring the patterning surface 112 of the template 108 into contact with the formable material 124 in imprint field i.

During a spreading step S306, the formable material 124 then spreads out towards the edge of the imprint field i and the mesa sidewalls 246. The edge of the imprint field may be defined by the mesa sidewalls 246. How the formable material 124 spreads and fills the trenches of the pattern can be observed via the field camera 136 and may be used to track a progress of a fluid front of formable material. The curing step S308 may occur after all the gaps between template and substrate are filled.

In a curing step S308, the processor 140 may send instructions to the radiation source 126 to send a curing illumination pattern of actinic radiation through the template 108, the mesa 110 and the patterning surface 112. The curing illumination pattern provides enough energy to cure (polymerize) the formable material 124 under the patterning surface 112.

In a separation step S310, the processor 140 uses one or more of the substrate chuck 104, the substrate positioning stage 106, template chuck 118, and the imprint head 120 to separate the patterning surface 112 of the template 108 from the cured formable material on the substrate 102.

If there are additional imprint fields to be imprinted then the process moves back to step S302. In an embodiment, additional processing is performed on the substrate 102 in a processing step S312 so as to create an article of manufacture (e.g. semiconductor device). In an embodiment, each imprint field includes a plurality of devices.

The further processing in processing step S312 may include etching processes to transfer a relief image into the substrate that corresponds to the pattern in the patterned layer or an inverse of that pattern. The further processing in processing step S312 may also include known steps and processes for article fabrication, including, for example, curing, oxidation, layer formation, deposition, doping, planarization, etching, formable material removal, dicing, bonding, and packaging, and the like. The substrate 102 may be processed to produce a plurality of articles (devices).

Drop Pattern Generation

It is useful to deposit a plurality of drops of formable material 124 onto a substrate 102 which is then imprinted/planarized. Imprinting/planarizing may be done in a field by field basis or on a whole wafer basis. The drops of formable material 124 may also be deposited in a field by field basis or on a whole substrate basis. Even when the drops are deposited on a whole substrate basis generating the drop pattern is preferably done on a field by field basis.

Generating a drop pattern for a full field may include a processor 140 receiving a substrate pattern of a representative substrate 102, and a template pattern of a representative template 108.

The substrate pattern may include information about substrate topography of the representative substrate, a field of the representative substrate and/or a full field of the representative substrate. The substrate topography may be measured, generated based on previous fabrication steps and/or generated based on design data. In an alternative embodiment, the substrate pattern is featureless either because there were no previous fabrication steps or the substrate had previously been planarized to reduce topography. The substrate topography may include information about the shape such as a bevel, a rounding of an edge of the representative substrate. The substrate topography may include information about the shape and position of one or more flats or notches which identify the orientation of the substrate. The substrate topography may include information about a shape and position of a reference edge which surrounds the area of the substrate on which patterns are to be formed.

The template pattern may include information about the topography of the patterning surface 112 of the representative template. The topography of the patterning surface 112 may be measured and/or generated based on design data. In an alternative embodiment, the template pattern of the representative embodiment is featureless and may be used to planarize the substrate 102. The patterning surface 112 may be the size as: an individual full field; multiple fields; the entire substrate, or larger than the substrate.

Once the substrate pattern and the template pattern are received, a processor 140 may calculate a distribution of formable material 124 that will produce a film that fills the volume between the substrate and the patterning surface when the substrate and the patterning surface are separated by a gap during imprinting. The distribution of formable material on the substrate may take the form of: an areal density of formable material; positions of droplets of formable material; and/or volume of droplets of formable material. Calculating the distribution of formable material may take into account one or more of: material properties of the formable material, material properties of the patterning surface, material properties of the substrate surface, spatial variation in volume between the patterning surface and the substrate surface; fluid flow, evaporation; etc.

Curable Composition

The above-described formable material is a curable composition. In order for the curable composition to be useable in the context of nanoimprinting and planarization, the curable composition contains an acrylate-based monomers, where the acrylate monomers are relatively small in size and viscosity. For example, with respect to the curable composition being acrylate monomer based, the curable composition may comprise at least 25 wt % acrylate monomers based on the total weight of the curable composition. In some example embodiments the amount of acrylate monomers may be at least 25 wt %, at least 30 wt %, at least 35 wt %, at least 50 wt %, at least 60 wt %, at least 70 wt %, at least 75 wt %, at least 80 wt %, at least 85 wt %, at least 87 wt %, at least 89 wt %, at least 89.5 wt %, at least 89.9 wt %, or at least 90 wt % based on the total weight of the curable composition. In some example embodiments the amount of acrylate monomers may be from 25 wt % to 90 wt %, 35 wt % to 89.9 wt %, from 50 wt % to 89.5 wt %, from 60 wt % to 89 wt %, from 70 wt % to 87 wt %, from 75 wt % to 85 wt % based on the total weight of the curable composition. That is, the acrylate monomers may be the major component of the curable composition.

With respect to the relatively small size, the acrylate monomers may have a molecular weight of 500 or less. In other example embodiments the molecular weight of the acrylate monomers may be 450 or less, 400 or less, 350 or less, 300 or less, 250 or less, 200 or less, or 150 or less. It should be understood that "or less" with respect to molecular weight does not include 0, i.e., does not include a case where the acrylate monomers have no weight because in such a case there would be no acrylate present. Thus, it should be understood that the recited value "or less" with respect to molecular weight means the value provided and anything smaller, as long as the amount is above 0. In some example embodiments the molecular weight of the acrylate monomers may be 120 to 500, 150 to 450, 200 to 400, or 250 to 300. By having acrylate monomers as the major component and having the relatively small size, the curable composition is suitable for nanoimprinting and planarizing processes. The acrylate monomers may be monofunctional, difunctional, or multifunctional.

Examples of suitable monofunctional acrylates include isobornyl acrylate, 3,3,5-trimethylcyclohexyl acrylate, dicyclopentenyl acrylate, Dicyclopentanyl Acrylate, benzyl acrylate, 1-naphthyl acrylate, 4-cyanobenzyl acrylate, pentafluorobenzyl acrylate, 2-phenylethyl acrylate, phenyl acrylate, (2-ethyl-2-methyl-1,3-dioxolan-4-yl)methyl acrylate, n-hexyl acrylate, 4-tert-butylcyclohexyl acrylate, methoxy polyethylene glycol (350) monoacrylate, Benzyl Methacrylate, 2-Methoxyethyl Acrylate, 2,2,2-trifluoroethyl acrylate, Lauryl Acrylate.

Examples of suitable diacrylates include ethylene glycol diacrylate, diethylene glycol diacrylate, triethylene glycol diacrylate, tetraethylene glycol diacrylate, 1,2-propanediol diacrylate, dipropylene glycol diacrylate, tripropylene glycol diacrylate, polypropylene glycol diacrylate, 1,3-propanediol diacrylate, 1,4-butanediol diacrylate, 2-butene-1,4-diacrylate, 1,3-butylene glycol diacrylate, 3-methyl-1,3-butanediol diacrylate, 1,5-pentanediol diacrylate, Neopentyl glycol diacrylate, 1,3-cyclohexane dimethanol diacrylate, Tricyclodecane dimethanol Diacrylate, 1,6-hexanediol diacrylate, 1H,1H,6H,6H-perfluoro-1,6-hexanediol diacrylate, 1,9-nonanediol diacrylate, 1,10-decanediol diacrylate, 1,12-dodecanediol diacrylate, neopentyl glycol diacrylate, cyclohexane dimethanol diacrylate, tricyclodecane dimethanol diacrylate, bisphenol A diacrylate, ethoxylated bisphenol A diacrylate, m-xylylene diacrylate, ethoxylated (3) bisphenol A diacrylate, ethoxylated (4) bisphenol A diacrylate, ethoxylated (10) bisphenol A diacrylate, dicyclopentanyl diacrylate, 1,2-adamantanediol diacrylate, 2,4-diethylpentane-1,5-diol diacrylate, poly(ethylene glycol) (400) diacrylate, poly (ethylene glycol) (300) diacrylate, 1,6-hexanediol $(EO)_2$ diacrylate, 1,6-hexanediol $(EO)_5$ diacrylate, and alkoxylated aliphatic diacrylate ester.

Examples of suitable multifunctional acrylates include trimethylolpropane triacrylate, propoxylated trimethylolpropane triacrylate (e.g., propoxylated (3) trimethylolpropane triacrylate, propoxylated (6) trimethylolpropane triacrylate), trimethylolpropane ethoxylate triacrylate (e.g., n~1.3,3,5), di(trimethylolpropane) tetraacrylate, propoxylated glyceryl triacrylate (e.g., propoxylated (3) glyceryl triacrylate), tris (2-hydroxy ethyl) isocyanurate triacrylate, pentaerythritol triacrylate, pentaerythritol tetracrylate, ethoxylated pentaerythritol tetracrylate, dipentaerythritol pentaacrylate, tripentaerythritol octaacrylate, Trimethylolpropane(PO)n Triacrylate (n is 1, 2, 3 . . . ), Trimethylolpropane(EO)n Triacrylate (n is 1, 2, 3 . . . ).

Preferably, the acrylate monomers may selected from the group consisting of isobornyl acrylate, neopentyl glycol diacrylate, benzyl acrylate, Benzyl Methacrylate, m-xylylene diacrylate, Tricyclodecane dimethanol Diacrylate, 1,6-hexanediol diacrylate, Dicyclopentenyloxyethyl Acrylate,1,4-Butanediol Diacrylate, 1,10-Decanediol Diacrylate, Dicyclopentenyl Acrylate, Dicyclopentanyl Acrylate, and their derivatives.

The acrylate monomers may further be selected based on the Ohnishi parameter. It has been known that a smaller value of N/(Nc-No) of monomer unit (N: total number of atoms of monomer unit, Nc: number of carbon atoms of monomer unit, No: number of oxygen atoms of monomer unit) provides a lower dry etching rate (Journal of Electrochemical Society, 130, 143 (1983)). The value of N/(Nc-No) is generally called "Ohnishi parameter." Preferably, the Ohnishi parameter of the acrylate monomers is 4.5 or less, 4.0 or less, 3.5 or less, 3.0 or less, 2.5 or less, 2.0 or less, 1.5 or less. That is, the Ohnishi parameter of the acrylate monomers may preferably be from 1.5 to 4.5.

The curable composition further comprises expanding monomers. The expanding monomers provide the benefit of relatively less shrinkage after curing as compared to a similar curable acrylate-based composition lacking the expanding monomers. In other words, if a comparative curable composition were prepared that does not contain the expanding monomers, but was otherwise substantially the same as the curable composition described herein, the comparative curable composition would shrink much more significantly after curing as compared to the amount of shrinking that occurs when the curable composition described herein is cured. In one example embodiment, the amount of shrinkage of the cured composition calculated by comparing the volume the cured composition to the volume of the curable composition (i.e., comparing the volume after curing compared to the volume prior to curing) is 3.5% or less, 3.0% or less, 2.5% or less, 2.0% or less, 1.5% or less, 1.0% or less, 0.5% or less, 0.25% or less, 0.1% or less, or 0.01% or less. Other examples include shrinkage of 0.1% to 3.5%, 0.25% to 3.0%, 0.5% to 2.5%, or 1.0% to 2.0%. For each of these percentages, it should be understood that the volume of the cured composition is the given percentage smaller than the original volume prior to the curing. For example, if the volume of the curable composition is "100" then the volume of the cured composition is "97" when the shrinkage is 3.0%. Because the shrinkage is defined in terms of percentage change in volume, the particular unit of volume is not relevant. Furthermore, it should be understood that "or less" with respect to change in volume may include 0 because there can be no change in volume. In one example aspect, the linear shrinkage, i.e., the shrinkage in one direction, may be used to represent the overall volume shrinkage. For example the linear shrinkage representing overall volume shrinkage may be measured in the height direction, i.e., the direction of thickness of the dispensed composition.

The amount of expanding monomers in the curable composition may be selected such that the above-noted amount of volume shrinkage is achieved. For example, the curable composition may comprise at least 10 wt % expanding monomers based on the total weight of the curable composition. In some example embodiments the amount of expanding monomers may be at least 15 wt %, at least 20 wt %, at least 30 wt %, at least 40 wt %, at least 50 wt %, at least 60 wt %, or at least 70 wt %, based on the total weight of the curable composition. In some example embodiments the amount of expanding monomers may be from 10 wt % to 70 wt %, from 15 wt % to 60 wt %, from 20 wt % to 50 wt %, or from 30 wt % to 40 wt %, based on the total weight of the curable composition. That is, the expanding monomers may be the largest or the second largest component of the curable composition.

The total amount of the expanding monomers and acrylate monomers may be at least 85 wt % based on the total weight of the curable composition. In some example embodiments the total amount of expanding monomers and acrylate monomers may be at least 87 wt %, at least 90 wt %, at least 93 wt %, at least 95 wt %, at least 97 wt %, at least 98 wt %, or at least 99 wt % based on the total weight of the curable composition. In some example embodiments the total amount of expanding monomers and acrylate monomers may be from 85 wt % to 99 wt %, from 87 wt % to 98 wt %, from 90 wt % to 97 wt %, or from 93 wt % to 97 wt %, based on the total weight of the curable composition. That is, whichever amount of acrylate monomers that is selected within the above-disclosed range of acrylate monomers and whichever amount of expanding monomers that is selected within the above-disclosed range of expanding monomers, the combination of those two amounts falls within the above-disclosed total ranges of monomers.

Preferably, the components and the relative amounts of components of the curable composition are selected such that the Ohnishi parameter of the overall composition is 4.0 or less, 3.5 or less, 3.0 or less, 2.5 or less, 2.0 or less, 1.8 or less. That is, the Ohnishi parameter of the overall curable composition may preferably be from 1.8 to 4.0.

The expanding monomers may be cationically, anionically, and/or free radical polymerizable. The expanding monomers may comprise one or more three-membered rings, one or more four-membered rings, one or more five-membered rings, one or more six-membered rings, one or more seven-member rings. The expanding monomers may comprise one or more rings that is greater than seven-member. The expanding monomers may have a single ring, double rings, or twist rings.

The expanding monomers can be classified as a bicyclic orthoester (BOE, cationically polymerizable), a cyclic carbonate (cationically or anionically polymerizable), spiro orthocarbonate (SOC, cationically polymerizable), spiro orthoester (SOE, cationically polymerizable), bicyclic monolactone (cationically or anionically polymerizable), bicyclic bislactone (cationically or anionically polymerizable). Among them, some contain carbon-carbon double bonds at the orth position to form unsaturated SOE (free radical polymerizable), unsaturated SOC (free radical polymerizable). These unsaturated SOEs and SOCs can be polymerized by free radical as well. An epoxide is a three-membered single ring compound. It can contain two or more epoxy groups. In general, epoxides are considered to be expanding monomers because a monofunctional epoxide shows some degree of shrinkage during polymerization. However, the shrinkage is much less compared with non-ring opening polymerization such as acrylates. In some cases, multifunctional epoxides show nearly zero shrinkage. Thus, as used herein, multifunctional epoxides are included within the meaning of expanding monomers. Epoxides can be initiated cationically or free radically.

Examples of suitable expanding monomers include 3,4-Epoxycyclohexylmethyl 3,4-epoxycyclohexanecarboxylate (EHEHC)

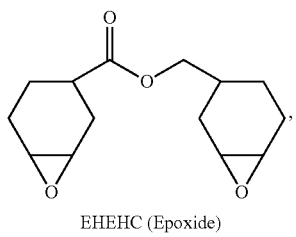 [SMILES: O=C(OCC1CCC2OC2C1)C1CCC2OC2C1]

EHEHC (Epoxide)

1,4-Cyclohexanedione bis(ethylene ketal) (CHDB)

CHDB, (SOC)

Spiro[1,3-benzodioxole-2,2'(3'H)-furan], octahydro-(SBOF)

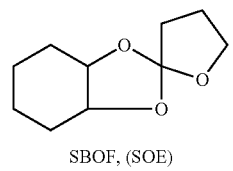

SBOF, (SOE)

1,5,7,11-Tetraoxaspiro[5.5]undecane, 3,9-bis(phenylmethyl)-(SDPHU)

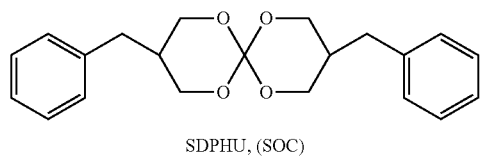 [SMILES: c1ccc(CC2COC3(OC2)OCC(Cc2ccccc2)CO3)cc1]

SDPHU, (SOC)

2-Methylene-4-phenyl-1,3-dioxolane (MPDO)

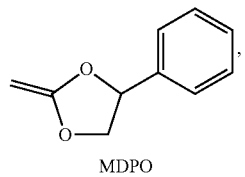

MDPO cyclic Carbonate 2-Methylene-1,4,6-trioxaspiro[4.4]nonane (MTS)

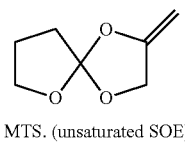

MTS. (unsaturated SOE)

Other examples SOC include the following: 3,9-di(5-norbornene-2-yl)-1,5,7,11-tetraoxaspiro [5,5] undecane (NSOC) (DER332), 3,9-dimethylene-1,5,7,11-tetraoxaspiro [5,5] undecane (DMSOC), Tetramethyl spiro ortho arbonate (TMSOC)(EPON 815), Dicyclohexene spiro ortho arbonate (DCHeSOC), Dicyclohexane spiro ortho arbonate (DCHaSOC), and expoxidized NSOC.

Examples SOEs (both saturated and unsaturated) include the following:1,4,6-Trioxaspiro [4,4] nonane (TON), 2-Methylene-1,4,6-trioxaspiro [4,4] nonane (MTON), 2-Methylene-I,4,6-trioxaspiro [4,6] decane, 2-Methylene-1,4,6-trioxaspiro [4,4] undecane, 2-Methyl-7-methylene-I,4,6-trioxaspiro[4,4] nonane, 2-Butyl-7-methylene-1,4,6-trioxaspiro[4,4] nonane, 7-bromomethyl-2-Butyl-1,4,6-trioxaspiro[4,4] nonane, Spiro-7-oxabicyclo [4,3,0] nonane-8,2'-(1',3')-dioxalane, Spiro-7,9-dioxacyclo [4,3,0] nonane-8,2'-1'-oxcyclo-pentane, Spiro-1,3-dioxalane-2,1'-(3H)-isobenzo-furan, Spiro-7,9-dioxabicyclo [4,3,0] nonane-8,8'-7'-oxabicyclo [4,3,0] nonane, Adduct of phenyldiglycidyl ether and γ butyrolactone.

Example SOC (saturated and unsaturated) include the following: 1,4,6,9-Tetraoxasplro [4,4] nonane, 1.5.7.11-Tetraoxasplro [5.5] undecane, 1,6,8,13-Tetraoxaspiro [6,6] tridecane, 3-Methylene-1,5.7, 11-tetraoxaspiro [4.5] decane, 3-Methylene-1,5,7,11-tetraoxaspiro [5.6] dodecane, 3-Methylene-1,5,7,11-tetraoxasplro [5,5] undecane, 3,9-Dimethylene-1,5,7,11-tetraoxaspiro [5.5] undecane (DMSOC), 3,3-Dimethyl-9-methylene-1,5,7,11-tetraoxaspiro [5.5] undecane, 3,9-Dicyclohexane-1,5,7,11-tetraoxaspiro [5.5] undecane, 3,9-Di (5-norbornene-2-yl 1.5,7,11-telraompiro [5,5] undecane (NSOC), Epoxidized NSOC, 3.9-Di(9,10-dihydro-9,10.ethano anthracenyl)-I.5.7,11-tetraoxaspiro [5.5] undecane, 2,3.7.8-Di(9,10-anthrylene) 1,4,6,9-tetraoxaspiro [4.4] nonane, 2,3,7,8-B1s (o-phenylene) 1.4.6.9-tetraoxaspiro [4.4] ronane, 3,9-Di {benzyl-(I', 4'-vinyl)} I, 5,7,11-tetraoxaspiro [5.5] undecane, 3,4,10,11-Bis {endo-(1' 4-butylene)}I 1,6,8,13-tetraoxaspiro [6.6] tridecane, 3,4,10,11-Bis-(o-phenylene) 1,6,8,13-tetraoxaspiro [6,6] tridecane, 3,4,10,11-Bis-{endo-(1',4'-endomethylene) 1',4'-buten-2'-ylidene}1,6,8,13-tetraoxaspiro [6,6] tridecane (DMSOC), 3.9-dibenzyl-1,5.7_11-tetraoxaspiro [5,5] undecane (DMSOC), 3,9-dihicyclohexene-1,5,7,11-tetraoxaspiro [5,5] undecane (DCHeSOC). 3,3-Diethyl-9-methylene-1,5, 7,11-tetraoxaspiro [5.5] undecane, 1,4,6,10,12,15,17,19-Octaoxatrispira [4,2,2,4,2,2] nonane.

More examples of aromatic SOCs include: Dispiro[1,3-benzodioxole-2,2'-benzo[1,2-d:4,5-d']bis[1,3]dioxole-6',2''-[1,3] benzodioxole], 5,5''-Bi-2,2'-spirobi[1,3-benzodioxole], 2,2'-Spirobi[1,3-benzodioxole], 5-(2,2'-spirobi[1,3-benzodioxol]-5'-ylsulfonyl)-, Methanone, 2,2'-spirobi[1,3-benzodioxol]-4-yl-2,2'-spirobi[1,3-benzodioxol]-5'-yl-.

More example of unsaturated SOCs include: 1,5,7,16-Tetraoxadispiro[5.2.5.2]hexadec-11-ene, 3-methylene-, 2-methyl-9-methylidene-1,5,7,11-tetraoxaspiro[5.5]undecane, 2-(propan-2-yl)-1,5,7,11-tetraoxaspiro [5.5]undecane, 8,8-dimethyl-2-methylidene-1,4,6,10-tetraoxaspiro[4.5]decane, 4''-methylidenedispiro[bicyclo[2.2.1]hept-5-ene-2,5'-[1,3]dioxane-2',2''-[1,3]dioxolane], 2-methylidene-7-phenyl-1,4,6,9-tetraoxaspiro[4.4]nonane, 5''-methylidenedispiro[bicyclo[2.2.1]hept-5-ene-2,5'-[1,3] dioxane-2',2''-[1,3]dioxane], 3,3-dimethyl-9-methylidene-1, 5,7,12-tetraoxaspiro[5.6]dodecane, 4'-methylidene-1,5-dihydrospiro[[2,4]benzodioxepine-3,2'-[1,3]dioxolane].

Example BOE include the following: 2,6,7-trioxabicyclo [2,2,2,) Octane and its derivatives: 1,4-diethyl-2,6,7-trioxabicyclo[2.2.2]octane, 1-ethyl-2,6,7-trioxabicyclo[2.2.2]octane, 4-ethenyl-1-ethyl-2,6,7-trioxabicyclo[2.2.2]octane, 4-ethyl-2,6,7-trioxabicyclo[2.2.2]octane, 1-ethenyl-4-ethyl-2,6,7-trioxabicyclo[2.2.2]octane, 1-[2-bromoethenyl]-4-ethyl-2,6,7-trioxabicyclo[2.2.2]octane, 4-ethyl-1-phenyl-2, 6,7-trioxa bicyclo[2.2.2]octane, 1,4-diphenyl-2,6,7-trioxa bicyclo[2.2.2]octane, (1-phenyl-2,6,7-trioxabicyclo[2.2.2] octan-4-yl)methyl ethylcarbamate, (1-phenyl-2,6,7-trioxabicyclo[2.2.2]octan-4-yl)methyl methylcarbamate, (1-ethyl-2, 6,7-trioxabicyclo[2.2.2]octan-4-yl)methyl ethylcarbamate, (1-butyl-2,6,7-trioxabicyclo[2.2.2]octan-4-yl)methyl ethylcarbamate, (1-propyl-2,6,7-trioxabicyclo[2.2.2]octan-4-yl) methyl ethylcarbamate, 1-methyl-2,6,7-trioxabicyclo[2.2.2] octane, 4-ethyl-1-propyl-2,6,7-trioxabicyclo[2.2.2]octane, (4-ethyl-2,6,7-trioxabicyclo[2.2.2]octan-1-yl)methanol. Other examples are 2,6,7-trioxabicyclo[3.1.1]heptane, 2,6, 7-trioxabicyclo[2.2.1]heptane.

The curable composition may include one of the above expanding monomers or a mixture of two or more of the above expanding monomers. When a mixture is used, the total amount of the expanding monomers in the curable composition is the amount provided above.

The ratio of the amount of acrylate monomers to the amount of expanding monomers (X:Y, where X is the amount of the acrylate monomers and Y is the amount of expanding monomers) may be 4:1 to 1:3, 2:1 to 4:11, 4:3 to 2:5, or 1:1 to 1:2. Examples include 1:1, 1:1.5, 1:2, 1:2.5, and 1:3.

Expanding monomers preferably include a ring with a radical polymerizable functional group. The radical polymerizable functional group may be carbon-carbon double bond or epoxide group. Preferably, the radical polymerizable functional group is an acrylate group for enhanced compatability with the acrylate monomer.

The curable composition further comprises a photoinitiator. The photoinitiator is a molecule that creates reactive species when exposed to radiation, e.g., UV radiation. The reactive species promote the polymerization of the curable composition into a polymerized cured composition. The curable composition may comprise 5 wt % or less photoinitiator based on the total weight of the curable composition. In some example embodiments the amount of photoinitiator may be at least 4 wt % or less, 3 wt % or less, 2.5 wt % or less, 2.0 wt % or less, 1.5 wt % or less, 1.0 wt % or less, 0.5 wt % or less, based on the total weight of the curable composition. It should be understood that "or less" with respect to amount of photoinitiator does not include 0, i.e., does not include a case where there is no photoinitiator present because as stated above the curable composition comprises a photoiniator. Thus, it should be understood that the recited value "or less" with respect to the amount photoinitiator means the value provided and lower as long as the amount is above 0. In some example embodiments the amount of photoinitiator may be from 0.5 wt % to 4 wt %, from 1.0 wt % to 3 wt %, or from 2.0 wt % to 2.5 wt % based on the total weight of the curable composition. That is, the photoinitiator may be a minor component of the curable composition.

The photoinitiator may be a cationic, anionic, or free radical photoinitiator. In an example embodiment the photoinitiator is a cationic photoinitiator. The photoinitiator may be metal free when the curable composition is used as part of the process of fabricating semiconductors, which requires there be no metal ions present. The photoinitotar may be a iodonium, phosphonium or sulfonium based photo acid generator, where the counter ion may be a halide, a triflate, nitrate, sulfonate, phosphate excluding metals. The photoinitiator may be diphenyliodonium hexafluorophosphate (DPIPF), Tetraphenylphosphonium halides, triphenylsulfonium triflate, Bis(4-tert-butylphenyl)iodonium perfluoro-1-butanesulfonate, Bis(4-tert-butylphenyl)iodonium p-toluenesulfonate, Diphenyliodonium nitrate, Triphenylsulfonium triflate, Tris(4-tert-butylphenyl)sulfonium perfluoro-1-butanesulfonate. A single photoinitiator may be present in the curable composition or a combination of photoinitiators may be present in the curable composition.

Example photoiniators include the following:

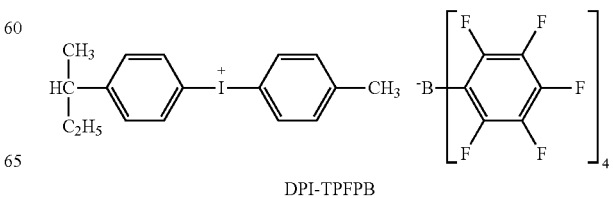

DPI-TPFPB

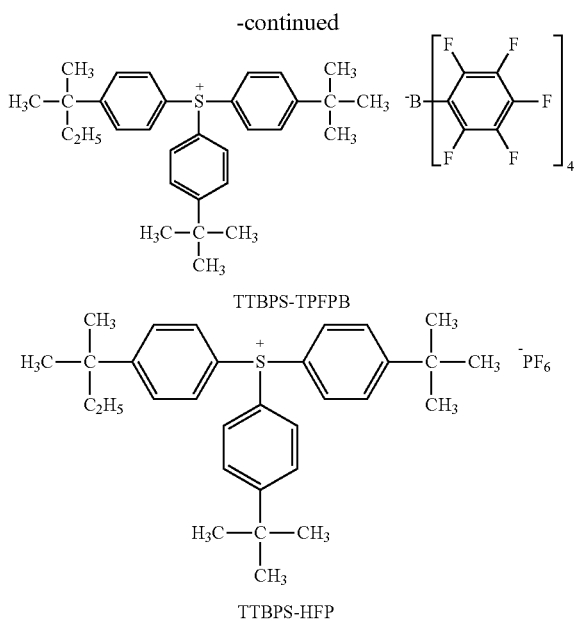

TTBPS-TPFPB

TTBPS-HFP

The curable composition further comprises a photosensitizer. The photosensitizer is a molecule that produces a chemical change in another molecule in a photochemical process. The reactive species promote the polymerization of the curable composition into a polymerized cured composition. In particular in cationic polymerization conditions, the photosensitizer will speed up the polymerization reaction so that the cured product can be produced much more quickly. For example, a cationic polymerization reaction of the above-listed acrylate monomers and expanding monomers may take minutes or even hours to complete. However, with an appropriate photosensitizer, the polymerization reaction may be completed in seconds, i.e., from 0.1 to 100 seconds. A fast curing time is particularly desirable in nanoimprinting and planarization processes, which are high-throughput operations.

The curable composition may comprise 2 wt % or less photosensitizer based on the total weight of the curable composition. In some example embodiments the amount of photosensitizer may be 1.75 wt % or less, 1.5 wt % or less, 1.25 wt % or less, 1.0 wt % or less, 0.75 wt % or less, 0.6 wt % or less, 0.5 wt % or less, 0.3 wt % or less, 0.2 wt % or less, or 0.1 wt % or less, based on the total weight of the curable composition. It should be understood that "or less" with respect to the amount of photosensitizer does not include 0, i.e., does not include a case where there is no photosensitizer present because as stated above the curable composition comprises a photosensitizer. Thus, it should be understood that the recited value "or less" with respect to the amount of photosensitizer means the value provided and lower as long as the amount is above 0. In some example embodiments the amount of photosensitizer may be from 0.1 wt % to 2.0 wt %, from 0.2 wt % to 1.75 wt %, from 0.3 wt % to 1.5 wt %, from 0.5 wt % to 1.25 wt %, or from 0.75 wt % to 1.0 wt %, based on the total weight of the curable composition. That is, the photosensitizer may be a minor component of the curable composition.

The photosensitizer may be benzophenone and its derivatives. The photosensitizer may be 2-isopropylthioxanthone (ITX), benzophenone, phenyl benzophenone, 4,4'-bis(diethylamino)benzophenone, 4-benzoyl Mol. Wt.: 324.46 4'-methyldiphenyl sulfide, methyl 2-benzoylbenzoate, 2-isopropylthioxanthone, xanthone, t-butyl anthraquinone, phenothiazine, 7-diethylamino-4-methylcoumarin. A single photosensitizer may be present in the curable composition or a combination of photosensitizers may be present in the curable composition.

The curable composition may further comprise a surfactant. The surfactant provides the curable composition with a suitable surface tension to allow for better separation from the template/superstrate after UV exposure. That is, the curable composition having the surfactant is more easily separated from the template/superstrate than a curable composition lacking a surfactant. The surfactant works as releasing agent to help to reduce the separation energy when pulling the template away from the curable composition after it has been cured. The curable composition may comprise 5 wt % or less surfactant based on the total weight of the curable composition. It should be understood that when the surfactant is present, "or less" with respect to the amount of surfactant does not include 0. Thus, it should be understood that the recited value "or less" with respect to the amount of surfactant means the value provided and lower as long as the amount is above 0. In some example embodiments the amount of surfactant may be at least 4.0 wt % or less, 3.0 wt % or less, 2.0 wt % or less, 1.0 wt % or less, 0.5 wt % or less, or 0.25 wt % or less, based on the total weight of the curable composition. In some example embodiments the amount of surfactant may be from 0.25 wt % to 5 wt %, from 0.5 wt % to 4.0 wt %, or from 1.0 wt % to 3.0 wt %, based on the total weight of the curable composition. That is, the surfactant may be a minor component of the curable composition.

The surfactant may be non-ionic, in some case, it can be fluorinated surfactant. Fluorinated surfactants may include one or more poly(oxyalkylenes). Suitable commercially available examples of non-ionic fluorinated surfactant components included are sold by Dupont under product names ZONYL® FSO-100; sold by 3M Company FC-4432, FC-4430; sold by Mason Chemical Company of Arlington Heights, under the product names MASURF FS-2000; sold by Ciba-Geigy Corp under the product name Lodyne S-222N; and sold by Dainippon Ink & Chemical under the product name MegaFace R-08, Chemiguard S554, S550-100 or S550 (Chemguard), S222N (Chemguard), S559-100 or S559 (Chemguard), Capstone@ FS-31 (DuPont™), Capstone@ FS-35 (DuPont™), Capstone@ FS-34 (DuPont™), Capstone@ FS-30 (Dupont™), Capstone@ FS-3100 (Dupont™), Masurf® FS-2950 (Mason), Masurf® FS-3240 (Mason), Masurf® FS-2900 (Mason), Masurf® FS-2825 (Mason), Masurf® FS-1700 (Mason), Masurf® FS-1800 (Mason), and Megaface 550 (DIC) FTERGENT 222F, FTERGENT 251, FTERGENT 250, DEO-5, DEO-15, PolyFox PF-656.

In some other cases, the surfactant can be non-fluorinated. the non-fluorinated surfactant may include poly(oxyalkylene) groups. Suitable commercial available examples include Pluronic L43, L44, L42, L61, L62, L63, L64, L65, L81, L72, L31, L121, L101, L122, L92; Pluriol® A 500 PE, Dow Synalox series including 25-220B, 25-300B, 40-60B, Terigitaol SD, XH; Huntsman JEFFOX WL660, 5000, Croda Atlas™ G-5000, Claritant Polyglykol B 11-type (B11/30, B11/50, B11/70), Polyglykol D-type (D21/100, D21/150, D21/220), Polyglykol P 41-type (P41/200, P41/300).

Other additives may also be included in the curable composition. The additives can be inhibitors, thermal initiators, porogens etc. Inhibitors are used to stabilizer the resist and to extend its shelf life. The inhibitors can be hindered phenols, secondary aromatic amines phosphite esters and thioethers, benzofuranone, acrylated bisphenols. Examples include 4-Methoxyphenol, 2,6-Di-tert-butyl-p-cresol, 3,5-bis(1,1-dimethylethyl)-4-hydroxybenzenepropanoic acid, C13-15 branched alkyl esters, Pentaerythritol tetrakis(3,5-di-tert-butyl-4-hydroxyhydrocinnamate), 2,2'-Methylenebis(6-tert-butyl-4-methylphenol), N,N'-bis(1,4-dimethylpentyl)-p-phenylenediamine, Bis[4-(2-phenyl-2-propyl)phenyl]amine, N-(1,3-Dimethylbutyl)-N'-phenyl-1,4-phenylenediamine, Bis(1,2,2,6,6-pentamethyl-4-piperidyl) sebacate, Methyl 1,2,2,6,6-pentamethyl-4-piperidyl sebacate, 2,2,6,6-Tetramethyl-4-piperidinyl stearate Bis(2,4-di-tert-butylphenyl)pentaerythritol diphosphate, Tris(2,4-di-tert-butylphenyl) phosphite, Dioctadecyl 3,3'-thiodipropionate, 2,2-Bis[[3-(dodecylthio)-1-oxopropoxy]methyl]propane-1,3-diyl bis[3-(dodecylthio)propionate].

A thermoinitiator helps to further polymerize the curable composition when it is at elevated temperature so to improve the mechanical strength or to cancel the shrinkage and stress induced by baking process. Some curable components may not be 100% cured under light exposure. When the cured resist is baked, the non-cured monomers or partial of the functional groups can go further curing when it is properly initiated. Preferably, the thermal initiators are stable at room temperature and will decompose and generate radicals or Lewis acid at elevated temperature, e.g., above 200° C., or 250° C. or more. Examples include Dicyandiamide, Cyclohexyl Tosylate, tert-Butyl hydroperoxide, Cumene hydroperoxide, 2,2'-Azodi(2-methylbutyronitrile), 2,2'-Azobis[2-(2-imidazolin-2-yl)propane] Dihydrochloride, Diphenyl (methyl)sulfonium tetrafluoroborate.

When additives are present, the additives may make up whatever amount remains after selecting the amount of the acrylic monomers, the expanding monomers, the photoinitiators, the photosensitizers, and the surfactants. For example, the curable composition may comprise 2 wt % or less additives based on the total weight of the curable composition. In some example embodiments the amount of additives may be at least 1.75 wt % or less, 1.5 wt % or less, 1.0 wt % or less, 0.75 wt % or less, 0.5 wt % or less, 0.2 wt % or less, 0.02 wt % or less, or 0.002 wt % or less based on the total weight of the curable composition. It should be understood that when additives are present, "or less" with respect to the amount of additives does not include 0. Thus, it should be understood that the recited value "or less" with respect to the amount of additives means the provided value and lower as long as the amount is above 0. In some example embodiments the amount of additives may be from 0.002 wt % to 2 wt %, from 0.02 wt % to 1.75 wt %, from 0.2 wt % to 1.25 wt %, or from 0.5 wt % to 1.0 wt %, based on the total weight of the curable composition.

It should be understood that the total amount of all the components of the curable composition, by definition, cannot exceed 100 wt %. That is, whichever amount of acrylate monomers that is selected within the above-disclosed range of acrylate monomers, whichever amount of expanding monomers that is selected within the above-disclosed range of expanding monomers, whichever amount of photoinitiators that is selected within the above-disclosed range of photoiniators, whichever amount of photosensitizers that is selected within the above-disclosed range of photosensitizers, and whichever amount of other components such as the surfactant or additives, the combination is at most 100 wt %. In one example embodiment the curable composition consists only of the acrylate monomers, the expanding monomers, the photoinitiators, and the photosensitizers. In another example embodiment the curable composition consists only of the acrylate monomers, the expanding monomers, the photoinitiators, the photosensatizers, and the surfactants. In another example embodiment the curable composition consists only of the acrylate monomers, the expanding monomers, the photoinitiators, the photosensatizers, the surfactants, and the additives. In such embodiments the total amount of these components is, by definition, 100 wt %. In another example embodiment, the curable composition consists essentially of the of the acrylate monomers, the expanding monomers, the photoinitiators, and the photosensatizers, with some amount of other components that do not materially affect the curable compositions use in nanoimprinting/planarization nor affect the above-described shrinkage advantage. In another example embodiment, the curable composition consists essentially of the of the acrylate monomers, the expanding monomers, the photoinitiators, the photosensatizers, and the sufactants, with some amount of other components that do not materially affect the curable compositions use in nanoimprinting/planarization nor affect the above-described shrinkage advantage. In another example embodiment, the curable composition consists essentially of the of the acrylate monomers, the expanding monomers, the photoinitiators, the photosensatizers, the sufactants, and the additives, with some amount of other components that do not materially affect the curable compositions use in nanoimprinting/planarization nor affect the above-described shrinkage advantage. For example, the total amount of the acrylate monomers, the expanding monomers, the photoinitiators, and the photosensatizers may be at least 90 wt %, at least 93 wt %, at least 95% wt %, at least 97 wt %, at least 98 wt %, at least 99 wt % at least 99.5 wt %, at least 99.9 wt % based on the total weight of the curable composition. The remainder may be surfactants and/or additives. In another example, the total amount of the acrylate monomers, the expanding monomers, the photoinitiators, the photosensatizers, and the surfcantants may be at least 95 wt %, at least 96% wt %, at least 97 wt %, at least 98 wt %, at least 99 wt % at least 99.5 wt %, at least 99.9 wt % based on the total weight of the curable composition. The remainder may be additives.

In order for the curable composition to be used in nanoimprinting/planarization processes, the viscosity of the curable composition may be 10 cp or less at 25° C. In some example embodiments the viscosity of the curable composition may be 8 cp or less, 6 cp or less, or 5 cp or less at 25° C. It should be understood that "or less" with respect to viscosity does not include 0, i.e., does not include a case where the viscosity is 0 cp. Thus, it should be understood that the recited value "or less" with respect to viscosity means the value provided and lower as long as the amount is above 0. In some example embodiments the viscosity of the curable composition may be 2 cp to 10 cp, 3 cp to 8 cp, or 4 cp to 7 cp at 25° C. That is, the particular components and relative amounts of each component of the curable composition should be selected such that the combination of components results in a curable composition that has a viscosity with the above-listed ranges. If the viscosity of the curable composition is above 10 cp at 25° C., then the curable composition is not suitable for use in nanoimprinting/planarization because the drops will not be small enough when jetted by the fluid dispenser (e.g., will not be less 1 picoliter in size), and the drops will not spread sufficiently quickly into a continuous form negatively impacting throughput.

EXAMPLES

The composition of curable composition Examples 1-3 and Comparative Examples 1-4 are as follows:

Example 1 (EX1)—47 parts 3,4-Epoxycyclohexylmethyl 3,4-epoxycyclohexanecarboxylate (EHEHC) (expanding monomers), 50 parts isobornyl acrylate (IBOA) (monoacrylate monomers), 2.5 parts diphenyliodonium hexafluorophosphate (DPIPF) (photoinitiator), 0.5 parts 2-isopropylthioxanthone (ITX) (photosensitizer), and 1 part surfactant fluorinated surfactant FS2000M1 made by Wonda Science were combined to form a curable composition. Each of the components are weighted on a balance and placed into an opaque bottle. Next, the components in the bottle are vortex mixed for 1 min and then left on a roller mixer for about 8 hours to form the curable composition.

Example 2 (EX2)—15 parts 1,4-Cyclohexanedione bis(ethylene ketal) (CHDB) (expanding monomers), 85 parts IBOA, 2.5 parts DPIPF, 0.5 parts ITX, and 1 part surfactant were prepared using the same method as in Example 1.

Example 3 (EX3): 79 parts Spiro[1,3-benzodioxole-2,2'(3'H)-furan], octahydro-, (T1, shown below) (expanding monomers), 19 parts of neopentyl glycol diacrylate, 0.9 parts DPIPF, 0.2 parts ITX, and 1.6 part surfactant were prepared using the same method as in Example 1.

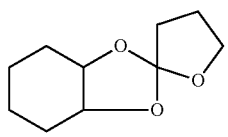

T1

Comparative Example 1 (CE1)—47 parts neopentyl glycol diacrylate (NPGDA) (diacrylate monomers), 50 parts IBOA, 2.5 parts DPIPF, 0.5 parts ITX, and 1 part surfactant were prepared using the same method as in Example 1. Notably, there are no expanding monomers in this curable composition.

Comparative Example 2 (CE2)—97 parts NPGDA, 2.5 parts DPIPF, 0.5 parts ITX, and 1 part surfactant were prepared using the same method as in Example 1. Notably, there are no expanding monomers in this curable composition.

Comparative Example 3 (CE3)—97 parts EHEHC, 2.5 parts DPIPF, 0.5 parts ITX, and 1 part surfactant were prepared using the same method as in Example 1. Notably, there are no acrylate monomers in this curable composition.

Comparative Example 4 (CE4): 79 parts IBOA (acrylate monomers), 19 parts of neopentyl glycol diacrylate, 0.9 parts DPIPF, 0.2 parts ITX, and 1.6 part surfactant were prepared using the same method as in Example 1.

The curable compositions of the Examples and Comparative Examples were tested for amount of shrinkage after curing. The shrinkage test was performed on an Anton Paar MCR-301 rehometer coupled with UV curing system and heater. A mercury UV lamp with a 340 nm broad band long wavelength filter with an intensity of 92-98 mW/cm$^2$ at 365 nm was used to cure each of the curable compositions for 25 minutes. The UV intensity varies, and a UV power meter was used to measure the UV light intensity at 365 nm. The total dosage can be calculated by the intensity×the exposure time. The induction time and curing time was recorded, together with the storage modulus and loss modulus. The curing time was recorded as the storage modulus reached 10 MPa. The induction period was recorded at the initiation of modulus increase. The volume change was recorded at 10 min curing time and/or 20 min curing time, based on when the volume change stabilized. The results are reported in the following Table 1.

TABLE 1

| Sample | UV@365 nm (mW/cm2) | Induction Time (s) | Cure Time (s) | Modulus @10 min UV | |
|---|---|---|---|---|---|
| | | | | Storage G' (Pa) | Loss G" (Pa) |
| EX1 | 92.1 | 1.7 | 9.4 | 2.06E+08 | 3.20E+07 |
| EX2 | 92.1 | 0.4 | 2.8 | 7.05E+07 | 6.10E+06 |
| EX3 | 100 | 1.4 | 7.5 | 3.7E+06 | 6.3E+05 |
| CE1 | 95 | 0.5 | 2.7 | 2.41E+08 | 2.87E+07 |
| CE2 | 100 | 0.2 | 1.9 | 2.55E+08 | 3.21E+07 |
| CE3 | 97.9 | 14 | 433 | 2.67E+07 | 2.56E+07 |
| CE4 | 100 | 0.6 | 6.6 | 2.1E+08 | 2.5E+07 |

The UV was started at 50 s recording point. The storage modulus of CE1, EX1, and EX2 increase sharply after initiation and reached their plateau at ~50 s. However, for CE3, which had only ring-opening monomer, showed a much slower slope with an induction period that was 10 times as long. Even at 10 min, CE3 did not finish the polymerization. This is believed to be because only cationic ring-opening mechanism exists in CE3 and the reaction was slow, while all the other formula had acrylates in and both radical and cationic polymerization happened. The addition of acrylate monomers increased the curing speed dramatically.

Table 2 reports the shrinkage for each of the Examples and Comparative Examples, measured at 10 min by rheometer:

TABLE 2

| Sample | Shrinkage at 10 min (%) |
|---|---|
| EX1 | 0.80% |
| EX2 | 3.10% |
| EX3 | 1.2% |
| CE1 | 3.90% |
| CE2 | 5.80% |
| CE3 | 0.20% |
| CE4 | 3.2% |

With respect to CE1, EX1, and EX2, Table 2 demonstrates how shrinkage is affected by the amount of expanding monomers. As seen in Table 2, by comparing EX1 to CE1, EX1 demonstrated only 0.8% shrinkage with 47 parts of 3-membered expanding monomer EHEHC versus the diacrylate NPGDA in CE1, almost completely compensated the shrinkage from the polymerization of acrylates. On the other hand, EX2 has a 5-membered ring CHDB, which is more expandable, compared to 3-membered ring. However, EX2 only had 15 parts CHDB. The end result showed a 21% net reduction in term of shrinkage compared to CE1 (from 3.9% to 3.1%). By using EX1, a planarization layer with a thickness of 100 nm may show a height shrinkage less than 1 nm, which is acceptable for the specification of some fabrication processes. For example, a lithography process to fabricate integrated circuit boards the planarization process can replace the more complicated and expensive process of chemical mechanical polishing (CMP).

With respect to CE2 and CE3, the volume shrinkage reduced to nearly zero when the monomer percentage was greatly increased. This has a direct impact on the height difference across a dispensed layer. If the dispensed layer is 50 nm in thickness, the height difference across the dispensed layer is only 0.1 nm. When the dispensed layer is 100 nm, as is commonly the case in the semiconductor field, the height shrinkage is about 0.2 nm, which is suitable for replacing CMP. With the curable composition of the Examples, one dispensing pass is likely sufficient to replace other planarization processes, e.g., spin-on carbon plus CMP process.

While CE3 does show very little shrinkage at 10 min, CE3 is not suitable for jet dispensing in the above-described dispensing system 100. In particular, CE3 has a viscosity of greater than 10 cP at at 25° C., which means it will not be jettable and cannot be used in the system 100 described above.

CE4 demonstrates that a curable composition having no expanding monomer and a mixture of acrylates had poor shrinkage at 10 min, i.e., greater than 3.0% percent. EX3 demonstrates that a curable composition having a majority of expanding monomer (the expanding monomer being different from the expanding monomer of the previous examples) in combination with a minority diacrylate component had good shrinkage at 10 min.

Each of the Examples also had a viscosity in the range of 7 to 9 cP at 25° C., i.e., lower than 10 cP. Thus, the curable compositions are jettable and can be dispensed by the above-described system 100 with sufficient accuracy and throughput.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. A curable composition, comprising:
   at least 10 wt % expanding monomers based on a total weight of the curable composition;
   at least 25 wt % acrylate monomers based on the total weight of the curable composition, the acrylate monomers having a molecular weight of 500 or less;
   a photoinitiator; and
   a photosensitizer,
   wherein the curable composition has a viscosity of 10 cP or less, and
   wherein a total amount of the expanding monomers and the acrylate monomers are at least 90 wt % based on the total weight of the curable composition, and
   wherein the expanding monomers, the amount of the expanding monomers, the acrylate monomers, the amount of the acrylate monomers, and the total amount of the expanding monomers and the acrylate monomers, are selected, in combination, such that a volume of a cured product obtained by curing the curable composition is 3.0% or less smaller than a volume of the curable composition prior to the curing.

2. The curable composition of claim 1, comprising:
   10 wt % to 50 wt % of the expanding monomers based on a total weight of the curable composition; and
   50 wt % to 90% of the acrylate monomers based on the total weight of the curable composition.

3. The curable composition of claim 1, wherein a total amount of the expanding monomers and the acrylate monomers are at least 95 wt % based on the total weight of the curable composition.

4. The curable composition of claim 1, wherein a ratio of an amount of the acrylate monomers to an amount of expanding monomers is from 4:1 to 1:3.

5. The curable composition of claim 1, wherein the expanding monomers comprise one or more rings having three or more members.

6. The curable composition of claim 1, wherein the expanding monomers are selected from the group consisting of spiro orthoesters, ortho carbonates, and bicyclic orthoesters.

7. The curable composition of claim 1, wherein the expanding monomers are selected from the group consisting of:

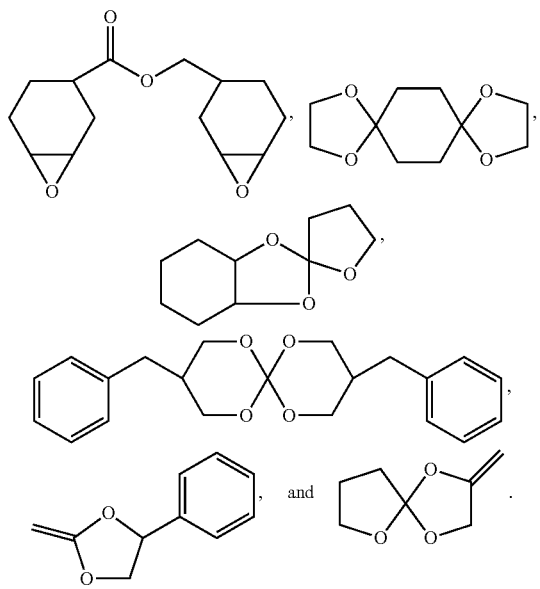

8. The curable composition of claim 1, wherein the expanding monomers comprise a mixture of different expanding monomers.

9. The curable composition of claim 1, wherein the acrylate monomers have an Ohnishi parameter of 4.5 or less.

10. The curable composition of claim 1, wherein the acrylate monomers are selected from the group consisting of isobornyl acrylate, neopentyl glycol diacrylate, neopentyl glycol diacrylate, benzyl acrylate, m xylylene diacrylate, tricyclodecane dimethanol diacrylate, 1,6-hexanediol diacrylate, dicyclopentenyloxyethyl acrylate, 1,4-Butanediol diacrylate, 1,10-decanediol diacrylate, dicyclopentenyl acrylate, and dicyclopentanyl acrylate, and their derivatives.

11. The curable composition of claim 1, wherein the acrylate monomers comprise a mixture of different acrylate monomers.

12. The curable composition of claim 1, comprising 5 wt % or less of the photoinitiator based on the total weight of the curable composition.

13. The curable composition of claim 1, comprising 3 wt % or less of the photosensitizer based on the total weight of the curable composition.

14. The curable composition of claim 1, wherein photoinitiator is a combination of metal-free cationic photoinitiator and radical photoinitiator.

15. The curable composition of claim 1, wherein a total amount of the expanding monomers, the acrylate monomers, the photoinitiator, and the photosensitizer are at least 98 wt % based on the total weight of the curable composition.

16. The curable composition of claim 1, further comprising a surfactant.

17. The curable composition of claim 1, wherein the expanding monomers are selected from the group consisting of a cyclic carbonates, unsaturated spiro orthoesters, ortho carbonates, bicyclic monolactones, bicyclic bislactones, and bicyclic orthoesters.

18. The curable composition of claim 1, wherein the expanding monomers are selected from the group consisting of:

 , 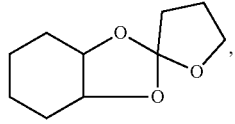 ,

-continued

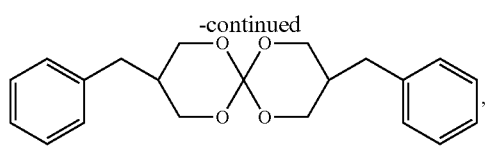 ,

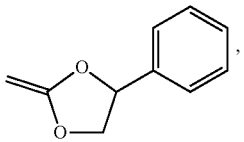 , and 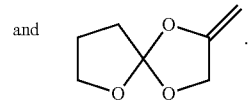 .

19. The curable composition of claim 1, wherein the photosensitizer is 2-isopropylthioxanthone.

20. The curable composition of claim 1, wherein the cured product is obtained by curing the curable composition using 365 nm ultraviolet light at an intensity of 92-98 mW/cm$^2$ for 10 seconds or less.

* * * * *